(12) United States Patent
Chen et al.

(10) Patent No.: US 12,002,881 B2
(45) Date of Patent: Jun. 4, 2024

(54) HETEROSTRUCTURE FOR A HIGH ELECTRON MOBILITY TRANSISTOR AND A METHOD OF PRODUCING THE SAME

(71) Applicant: SWEGAN AB, Linköping (SE)

(72) Inventors: Jr-Tai Chen, Vikingstad (SE); Olof Kordina, Vikingstad (SE)

(73) Assignee: SWEGAN AB, Linkoping (SE)

( * ) Notice: Subject to any disclaimer, the term of this patent is extended or adjusted under 35 U.S.C. 154(b) by 0 days.

(21) Appl. No.: 16/632,347

(22) PCT Filed: Jul. 20, 2017

(86) PCT No.: PCT/EP2017/068300
§ 371 (c)(1),
(2) Date: Jan. 18, 2020

(87) PCT Pub. No.: WO2019/015754
PCT Pub. Date: Jan. 24, 2019

(65) Prior Publication Data
US 2020/0203521 A1 Jun. 25, 2020

(51) Int. Cl.
*H01L 29/778* (2006.01)
*H01L 29/15* (2006.01)
(Continued)

(52) U.S. Cl.
CPC .......... *H01L 29/7787* (2013.01); *H01L 29/15* (2013.01); *H01L 29/2003* (2013.01); *H01L 29/205* (2013.01); *H01L 29/66462* (2013.01)

(58) Field of Classification Search
CPC ... H01L 29/15; H01L 29/2003; H01L 29/205; H01L 29/66462; H01L 29/7787
See application file for complete search history.

(56) References Cited

U.S. PATENT DOCUMENTS 6,156,581 A * 12/2000 Vaudo ..................... C30B 33/00
438/22
6,440,823 B1 * 8/2002 Vaudo ................. H01L 21/0242
257/E21.112
(Continued)

FOREIGN PATENT DOCUMENTS

JP 2005167275 A 6/2005
JP 2012248890 A 12/2012
(Continued)

OTHER PUBLICATIONS

Nam et al., "Lateral epitaxy of low defect density GaN layers via organometallic vapor phase epitaxy," Applied Physic Letters 71 (1997), pp. 2638-2640.*
(Continued)

*Primary Examiner* — Jay C Kim
(74) *Attorney, Agent, or Firm* — HULTQUIST, PLLC; Steven J. Hultquist (57) ABSTRACT

The present document discloses a heterostructure for a high electron mobility transistor (HEMT). The heterostructure comprises a SiC substrate, an $In_xAl_yGa_{1-x-y}N$ nucleation layer (12), wherein x=0-1, y=0-1, preferably x<0.05 and y>0.50, more preferably x<0.03 and y>0.70 and most preferably x<0.01 and y>0.90, formed on the SiC substrate. The heterostructure further comprises a GaN channel layer formed on the $In_xAl_yGa_{1-x-y}N$ nucleation layer. A thickness of the GaN channel layer is 50 to 500 nm, preferably 100 to 450 nm, most preferably 150 to 400 nm. The GaN channel layer presents a rocking curve with a (002) peak having a FMHW below 300 arcsec, and a rocking curve with a (102) peak having a FMHW below 400 arcsec as determined by X-ray diffraction, XRD. A surface of an uppermost layer of the heterostructure (1) exhibits an atomic step-flow morphology with rms roughness over a 10 μm² scan area of below 1.8 nm, preferably below 1.4 nm, most preferably (Continued)

below 1 nm, over a 3 µm² scan area of below 1 nm, preferably below 0.7 nm, most preferably below 0.4 nm, as determined by atomic force microscopy, AFM.

14 Claims, 6 Drawing Sheets
(4 of 6 Drawing Sheet(s) Filed in Color)

(51) Int. Cl.
    *H01L 29/20*         (2006.01)
    *H01L 29/205*       (2006.01)
    *H01L 29/66*         (2006.01)

(56) References Cited

U.S. PATENT DOCUMENTS

| | | | |
|---|---|---|---|
| 6,533,874 B1* | 3/2003 | Vaudo | H01L 21/0262 148/33.5 |
| 6,707,076 B2* | 3/2004 | Hori | H01L 21/0237 257/192 |
| 6,869,702 B2* | 3/2005 | Shibata | C30B 25/02 257/E21.127 |
| 6,958,093 B2* | 10/2005 | Vaudo | C30B 25/02 117/913 |
| 7,199,408 B2* | 4/2007 | Miyoshi | H01L 29/7787 257/192 |
| 7,220,658 B2* | 5/2007 | Haskell | H01L 21/02639 257/E21.097 |
| 7,338,828 B2* | 3/2008 | Imer | H01L 21/02458 257/E21.112 |
| 7,655,197 B2* | 2/2010 | Vaudo | H01L 21/02458 117/88 |
| 7,687,824 B2* | 3/2010 | Shibata | H01L 21/0262 257/103 |
| 7,723,216 B2* | 5/2010 | Chakraborty | H01L 21/02516 438/479 |
| 7,727,874 B2* | 6/2010 | Hanser | H01L 33/0075 257/E21.563 |
| 7,847,293 B2* | 12/2010 | Haskell | H01L 21/0242 257/E21.05 |
| 7,982,241 B2* | 7/2011 | Kuraoka | H01L 29/66462 257/194 |
| 8,134,181 B2* | 3/2012 | Sato | H01L 29/7787 257/192 |
| 8,435,879 B2* | 5/2013 | Hanser | H01L 21/02433 438/604 |
| 8,673,074 B2* | 3/2014 | Usikov | C30B 25/18 117/101 |
| 8,728,938 B2* | 5/2014 | Ivantsov | C30B 31/02 438/676 |
| 8,778,783 B2* | 7/2014 | Melnik | H01L 21/02505 438/478 |
| 8,952,419 B2* | 2/2015 | Tak | H01L 21/02505 257/190 |
| 8,999,788 B2* | 4/2015 | Kambayashi | H01L 21/302 438/270 |
| 9,236,530 B2* | 1/2016 | Chakraborty | H01L 21/02389 |
| 9,263,266 B2* | 2/2016 | Hanser | H01L 29/2003 |
| 9,382,641 B2* | 7/2016 | Ichimura | H01L 29/7786 |
| 9,396,933 B2* | 7/2016 | Zhu | H01L 21/0254 |
| 9,543,391 B2* | 1/2017 | Hwang | H01L 29/7789 |
| 9,653,554 B2* | 5/2017 | D'Evelyn | C30B 23/025 |
| 9,728,610 B1* | 8/2017 | Wan | H01L 29/205 |
| 9,748,410 B2* | 8/2017 | Kinoshita | H01L 29/66143 |
| 9,923,063 B2* | 3/2018 | Ishibashi | H01L 21/6835 |
| 9,978,845 B2* | 5/2018 | Han | H01L 29/15 |
| 9,978,904 B2* | 5/2018 | Krames | H01L 33/0075 |
| 10,170,303 B2* | 1/2019 | Jorgenson | H01L 21/02505 |
| 10,192,737 B2* | 1/2019 | Georgakilas | H01L 29/2003 |
| 10,224,458 B2* | 3/2019 | Furuya | H01L 21/02576 |
| 10,269,565 B2* | 4/2019 | Janzen | H01L 21/0254 |
| 10,403,746 B2* | 9/2019 | Janzén | H01L 21/02458 |
| 10,529,561 B2* | 1/2020 | Haider | H01L 21/02458 |
| 10,600,676 B2* | 3/2020 | Ishibashi | H01L 21/02513 |
| 11,453,956 B2* | 9/2022 | D'Evelyn | H01L 21/0254 |
| 2006/0043396 A1* | 3/2006 | Tsuda | H01L 29/66462 257/94 |
| 2007/0018198 A1* | 1/2007 | Brandes | H01L 29/7787 257/183 |
| 2007/0138505 A1* | 6/2007 | Preble | H01L 21/0242 257/190 |
| 2010/0289029 A1 | 11/2010 | Ichimura et al. | |
| 2011/0186855 A1 | 8/2011 | Ramdani | |
| 2015/0069407 A1 | 3/2015 | Matsubayashi et al. | |
| 2015/0279675 A1* | 10/2015 | Hanser | H01L 21/02433 438/478 |
| 2015/0279942 A1* | 10/2015 | Yui | H01L 21/02381 257/77 |
| 2016/0308039 A1* | 10/2016 | Saito | H01L 21/0262 |
| 2017/0179271 A1 | 6/2017 | Fenwick et al. | |
| 2017/0338122 A1* | 11/2017 | Daulton | H01J 37/32357 |

FOREIGN PATENT DOCUMENTS

| | | | | |
|---|---|---|---|---|
| JP | 201373962 A | | 4/2013 | |
| JP | 20164948 A | | 1/2016 | |
| KR | 1020150000753 A | | 1/2015 | |
| TW | 201340335 A | | 10/2013 | |
| WO | 2016110332 A1 | | 7/2016 | |
| WO | WO 2016/110332 | * | 7/2016 | H01L 21/02 |
| WO | 2016155794 A1 | | 10/2016 | |

OTHER PUBLICATIONS

Park et al., "Characterization of GaN thin film growth on 3C-SiC/Si(1 1 1) substrate using various buffer layers," Journal of Crystal Growth 224 (2001) pp. 190-194.*
Tanaka et al., "Reduction of the defect density in GaN films using ultra-thin AlN buffer layers on 6H-SiC," Journal of Crystal Growth 170 (1997) pp. 329-334.*
Nam et al., "Lateral Epitaxial Overgrowth of GaN Films on SiO2 Areas via Metalorganic Vapor Phase Epitaxy," Journal of Electronic Materials 27 (1998) pp. 233-237.*
Khan et al., "Effect of fully strained AlN nucleation layer on the AlN/SiC interface and subsequent GaN growth on 4H-SiC by MOVPE," Journal of Materials Science: Materials in Electronics 30 (2019) pp. 18910-18918.*
Corrion et al., "Structural and morphological properties of GaN buffer layers grown by ammonia molecular beam epitaxy on SiC substrates for AlGaN/GaN high electron mobility transistors," Journal of Applied Physics 103 (2008) 093529.*
Katzer et al., "Molecular beam epitaxy of beryllium-doped GaN buffer layers for AlGaN/GaN HEMTs," Journal of Crystal Growth 251 (2003) pp. 481-486.*
Waltereit et al., "Structural Properties of GaN Buffer Layers on 4H-SiC(0001) Grown by Plasma-Assisted Molecular Beam Epitaxy for High Electron Mobility Transistors," Japanese Journal of Applied Physics 43 (2004) pp. L 1520-L 1523.*
Chen, JT, et al., "Impact of residual carbon on two-dimensional electron gas properties in AlxGa1-xN/GaN heterostructure", Applied Physics Letters, 2013, pp. 193506.1-193506.5, vol. 102, Publisher: AIP Publishing LLC.
Davis, R.F., et al., "Epitaxial Growth of Gallium Nitride", AIP Conference Proceedings, 2007, pp. 520-540, vol. 916, Publisher: American Institute of Physics.
Hessinger, U., et al., "Role of Step and Terrace Nucleation in Heteroepitaxial Growth Morphology: Growth Kinetics of CaF2/Si(111)", Physical Review Letters, Sep. 18, 1995, pp. 2380-2383, vol. 75, No. 12, Publisher: The American Physical Society.
Li, X., et al., "Carbon doped GaN buffer layer using propane for high electron mobility transistor applications: Growth and device results", Applied Physics Letters, 2015, pp. 262105.1-262105.5, vol. 107, Publisher: AIP Publishing LLC.
Office Action issued in counterpart European Patent Application No. 17748683.4 dated Jan. 4, 2022.

(56) References Cited

OTHER PUBLICATIONS

Office Action issued in counterpart European Patent Application No. 177486834 dated Dec. 19, 2022.
Office Action issued in counterpart Indian Patent Application No. 202017001834 dated Mar. 2, 2022.
Office Action Issued in counterpart Japanese Patent Application No. 220502287 dated Jul. 6, 2021.
Office Action Issued in counterpart Japanese Patent Application No. 220502287 dated Jul. 6, 2021, English Translation.
Office Action issued in counterpart Korean Patent Application No. 1020207004339 dated Feb. 24, 2021.
Office Action issued in counterpart Korean Patent Application No. 1020207004339 dated Feb. 24, 2021, English Translation.
Office Action issued in counterpart Taiwan Patent Application No. 107124935 dated May 24, 2022.
Office Action issued in counterpart Taiwan Patent Application No. 107124935 dated May 24, 2022, English Translation.
Search Report in counterpart Taiwan Patent Application No. 107124935 dated May 24, 2022.
English Translation of Office Action issued in counterpart Chinese Patent Application No. 201780093410.7 dated Mar. 16, 2023.
Office Action issued in counterpart Chinese Patent Application No. 201780093410.7 dated Mar. 16, 2023.
Moram, M.A., et al., "X-ray diffraction of III-nitrides", Rep. Prog. Phys., 2009, 036502; doi10.1088/0034/72/3/036502, vol. 72.
Office Action issued in Chinese Patent Application No. 2017800934107 dated Sep. 26, 2023.
English Translation of Office Action issued in Chinese Patent Application No. 2017800934107 dated Sep. 26, 2023.

* cited by examiner

HETEROSTRUCTURE FOR A HIGH ELECTRON MOBILITY TRANSISTOR AND A METHOD OF PRODUCING THE SAME

CROSS-REFERENCE TO RELATED APPLICATIONS

This is a U. S. national phase under 35 USC § 371 of International Patent Application No. PCT/EP17/68300 filed Jul. 20, 2017. The disclosure of International Patent Application No. PCT/EP17/68300 filed Jul. 20, 2017 is hereby incorporated herein by reference in its entirety, for all purposes.

TECHNICAL FIELD

The present disclosure relates to a heterostructure for semiconductor devices and to a method for producing the same.

BACKGROUND

In Appl. Phys. Lett., 69, 1438 (1996) by Y.-F. Wu et al, an AlGaN/GaN heterostructure suitable for manufacturing of high electron mobility (HEMT) devices is disclosed. The heterostructure comprises a GaN nucleation layer and a GaN channel layer grown onto a sapphire substrate. The thickness of the GaN channel layer is about 0.3 to 0.4 µm. It is well known that the morphology of such a heterostructure is poor as illustrated in Journal of Applied Physics 113, 214503 (2013) by Lugani et al showing AFM images illustrating the poor morphology with a high number of defects.

SiC substrates have higher thermal conductivity as compared to sapphire substrates and are therefore preferable for use in HEMT devices. However, it is more difficult to grow the heterostructure onto SiC substrates as compared to growing the heterostructure on sapphire substrates.

In Applied Physics Express 8, 111001 (2015), a heterostructure is disclosed in which the AlGaN/GaN heterostructure is grown onto a SiC substrate. The thickness of the GaN channel layer in this heterostructure is 500 nm. Based on the low current density of this material, it can be expected that the two-dimensional electron gas (2 DEG) properties were limited by the material quality.

There is a need for a thin heterostructure in order to reduce the thermal resistance, to enhance the carrier confinement, to reduce buffer-related trapping effects and to reduce the time for production of the heterostructure. It would also be desirable to provide a heterostructure which has comparable, or even better, crystalline quality and/or morphology.

Examples of prior art are disclosed in Li X. et al, Applied Physics Letters, Vol. 107, No. 26, 28 Dec. 2015, Chen Jr-Tai et al, Applied Physics Letters, Vol. 102, No 19, 13 May 2013 and in US 2015/069407 A1.

SUMMARY

An object of the present invention is to provide a heterostructure which is improved in terms of one or more of the above mentioned properties.

The invention is defined by the appended independent claims, with embodiments set forth in the appended dependent claims, in the following description and in the drawings.

According to a first aspect, there is provided a heterostructure for a high electron mobility transistor (HEMT), comprising a SiC substrate, an $In_xAl_yGa_{1-x-y}N$ nucleation layer, wherein x=0-1, y=0-1, preferably x<0.05 and y>0.50, more preferably x<0.03 and y>0.70 and most preferably x<0.01 and y>0.90, formed on the SiC substrate, and a GaN channel layer formed on the $In_xAl_yGa_{1-x-y}N$ nucleation layer. In the heterostructure, a thickness of the GaN channel layer is 50 to 500 nm, preferably 100 to 450 nm, most preferably 150 to 400 nm, the GaN channel layer presents a rocking curve with a (002) peak having a FMHW below 300 arcsec, and a rocking curve with a (102) peak having a FMHW below 400 arcsec as determined by X-ray diffraction, XRD, and a surface of an uppermost layer of the heterostructure exhibits an atomic step-flow morphology with rms roughness over a 10 µm² scan area of below 1.8 nm, preferably below 1.4 nm, most preferably below 1 nm, over a 3 µm² scan area of below 1 nm, preferably below 0.7 nm, most preferably below 0.4 nm, as determined by atomic force microscopy, AFM.

"Formed on" may be construed as formed directly on, alternatively this may interpreted as there can be one or more additional layers which do not affect the function of the heterostructure The "nucleation layer" may have the function of an back barrier layer. This is however dependent on the thickness of the channel layer.

Typically, x+y≤1.

The uppermost layer of the heterostructure may be the GaN channel layer or any other layer, such as an exclusion layer, a barrier layer, or a passivation layer, on top of the GaN channel layer.

The SiC polytype may be 4H or 6H.

The SiC substrate may be pretreated by e.g. $H_2$, HCl, HF, HBr or a combination thereof.

Pretreatment may take place in situ by an etching gas, or ex situ by a liquid such as HF.

The temperature of the SiC substrate may be above 1250° C., preferably above 1300° C., most preferably above 1350° C. during such pretreatment, if the substrate is pretreated in situ by an etching gas.

The $In_xAl_yGa_{1-x-y}N$ nucleation layer may have a thickness of 2 to 200 nm, preferably 20 to 150 nm, most preferably 40 to 100 nm.

The $In_xAl_yGa_{1-x-y}N$ nucleation layer may be fully strained.

By fully strained is meant that the in-plane lattice constant of the nucleation layer is exactly the same, or exactly the same +/−0.15%, preferably +/−0.05% or +/−0.02%, as the in-plane lattice constant of the SiC substrate, Typically, if the nucleation layer is fully strained, its asymmetric X-ray reflex, like (105) would exhibit well-aligned with the SiC substrate's asymmetric X-ray reflex, like (1010), along the x axis in the reciprocal space map. "Pseudomorphic feature"="fully strained".

The $In_xAl_yGa_{1-x-y}N$ nucleation layer may have a homogenous or varying content of Al.

The Al content varies from low to high or high to low toward the GaN channel layer.

The interface between the $In_xAl_yGa_{1-x-y}N$ nucleation layer and the GaN channel layer may be intentionally doped with carbon and/or iron.

The GaN channel layer may be doped with iron.

A concentration of the iron atoms may be exponentially decreasing from a higher level near the nucleation layer to a lower level at a distance away from the nucleation layer.

The heterostructure may further comprise a superlattice having a periodic structure of layers of $Al_{x1}Ga_{1-x1}N$ and $Al_{x2}Ga_{1-x2}N$, wherein x1>x2, or a $In_{x5}Al_{y5}Ga_{1-x5-y5}N$ back barrier layer formed between the $In_xAl_yGa_{1-x-y}N$ nucleation layer and the GaN channel layer.

In the case of a back barrier layer, a composition may be constant in a thickness direction thereof. In such a composition, preferably x5<0.05, more preferably x5<0.03 and most preferably x5<0.01. Moreover, preferably 0.01<y5<0.1, more preferably 0.03<y5<0.09 and most preferably 0.05<y5<0.08.

Alternatively, in the case of a back barrier layer, the composition may vary in the thickness direction thereof. In such case, preferably x5<0.05, more preferably x5<0.03 and most preferably x5<0.01.

In embodiments with a varied composition, y5 may be continuously decreased towards the GaN channel, preferably Alternatively, in embodiments with a varied composition, y5 may be continuously increased towards the GaN channel, preferably from 0 to 0.7, more preferably from 0 to 0.6, most preferably from 0 to 0.5.

The heterostructure may further comprise a barrier layer, such as an $In_{x3}Al_{y3}Ga_{1-x3-y3}N$ barrier layer, wherein 0≤x3≤0.20, preferably 0≤x3≤0.17, most preferably 0≤x3≤0.12, and 0.15≤y3≤1, preferably 0.20≤y3≤0.90, most preferably 0.25≤y3≤0.85, or an $Al_{x4}Ga_{1-x4}N$ barrier layer, wherein 0.15≤x4≤1, preferably 0.20≤x4≤0.90, most preferably 0.25≤x4≤0.85, formed on the GaN channel layer or on an exclusion layer.

The barrier layer may have a thickness of 2 to 30 nm, preferably 4 to 20 nm, most preferably 6 to 15 nm.

The heterostructure may further comprise an AlN exclusion layer between the GaN channel layer and the barrier layer.

The exclusion layer may have a thickness of 0.5 to 3 nm, preferably 1.0 to 2 nm, most preferably 1.2 to 1.5 nm.

The heterostructure may further comprise a passivation/cap layer of SiN or GaN formed on the barrier layer.

The passivation layer may have a thickness of 0.5 to 20 nm, preferably 1 to 15 nm, most preferably 2 to 10 nm.

The total thickness of the heterostructure may be less than 1 μm, preferably less than 0.8 μm, most preferably less than 0.6 μm.

By "total thickness" is meant the thickness of the heterostructure, i.e. the total thickness of the nucleation layer, the channel layer, the barrier layer, the exclusion layer, the passivation layer and any layers such as a superlattice or a back barrier placed between these layers.

In the heterostructure, an unintentional doping concentration of carbon in the GaN channel layer may be less than 1E+17 $cm^{-2}$, preferably less than 5E+16 $cm^{-2}$, most preferably less than 3E+16 $cm^{-2}$.

According to a second aspect, there is provided a method of producing a heterostructure by metal organic chemical vapor deposition (MOCVD) for a high electron mobility transistor (HEMT). The method comprises providing a SiC substrate, providing an $In_xAl_yGa_{1-x-y}N$ nucleation layer, wherein x=0-1, y=0-1, preferably x<0.05 and y>0.50, more preferably x<0.03 and y>0.70 and most preferably x<0.01 and y>0.90, on the SiC substrate, providing a GaN channel layer on the $In_xAl_yGa_{1-x-y}N$ nucleation layer. The pressure upon growth of the $In_xAl_yGa_{1-x-y}N$ nucleation layer and of the GaN channel layer is 20 to 200 mbar, preferably 40 to 150 mbar most preferably 50 to 100 mbar, the temperature upon growth of the $In_xAl_yGa_{1-x-y}N$ nucleation layer is 900 to 1200° C., preferably 950 to 1150° C., most preferably 1000 to 1100° C., the temperature upon growth of the GaN channel layer is 1000 to 1150° C., preferably 1020 to 1100° C., most preferably 1040 to 1080° C., the $In_xAl_yGa_{1-x-y}N$ nucleation layer is provided at a thickness of 2 to 200 nm, preferably 20 to 150 nm, most preferably 40 to 100 nm. The GaN channel layer is provided at a thickness of 50 to 500 nm, preferably 100 to 450 nm, most preferably 150 to 400 nm.

The SiC substrate may be pretreated by e.g. $H_2$, HCl, HF, HBr or a combination thereof.

The temperature of the SiC substrate may, upon pretreatment, be above 1250° C., preferably above 1300° C., most preferably above 1350° C.

The method may further comprise providing a barrier layer, such as an $In_xAl_yGa_{1-x-y}N$ barrier layer, wherein 0≤x≤0.20, preferably 0≤x≤0.17, most preferably 0≤x≤0.12, and 0.15≤y≤1, preferably 0.20≤y≤0.90, most preferably 0.25≤y≤0.85, or an $Al_xGa_{1-x}N$ barrier layer, wherein 0.15≤x≤1, preferably 0.20≤x≤0.90, most preferably 0.25≤x≤0.85, formed on the GaN channel layer.

In the method, the pressure upon growth of the barrier layer is 20 to 200 mbar, preferably 40 to 150 mbar, most preferably 50 to 100 mbar. In the method, the temperature upon growth of the barrier layer may be 700 to 1150° C., preferably 750 to 1100° C., most preferably 780 to 1080° C.

The method may further comprise a step of providing an AlGaN exclusion layer, wherein the Al content is 40 to 80%, preferably 45 to 75%, most preferably 50 to 70% between the barrier layer and the GaN channel layer. In the method, the pressure upon growth of the exclusion layer is 20 to 200 mbar, preferably 40 to 150 mbar, most preferably 50 to 100 mbar.

In the method, the temperature upon growth of the exclusion layer may be 1000 to 1150° C., preferably 1020 to 1100° C., most preferably 1040 to 1080° C.

The method may further comprise providing a passivation layer of SiN or GaN on the barrier layer.

In the method, the pressure upon growth of the passivation layer may be 20 to 200 mbar, preferably 40 to 150 mbar, most preferably 50 to 100 mbar.

In the method, the temperature upon growth of the passivation layer may be 700 to 1150° C., preferably 750 to 1100° C., most preferably 780 to 1080° C.

According to a third aspect, there is provided a method of producing a HEMT device comprising the steps of providing a heterostructure as described above and providing a source, a gate and a drain contact onto the passivation layer.

The method may further comprise the step of providing an insulating layer between the passivation layer and the gate contact.

DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

The concept disclosed herein will now be explained in more detail.

Initially the method for producing a $In_xAl_yGa_{1-x-y}N$/GaN heterostructure is described, thereafter characterization results of such a heterostructure are discussed.
Heterostructure As discussed above, $In_xAl_yGa_{1-x-y}N$/GaN heterostructures may be used in semiconductor devices, such as in high electron mobility transistor (HEMT) devices.

Figure 1:
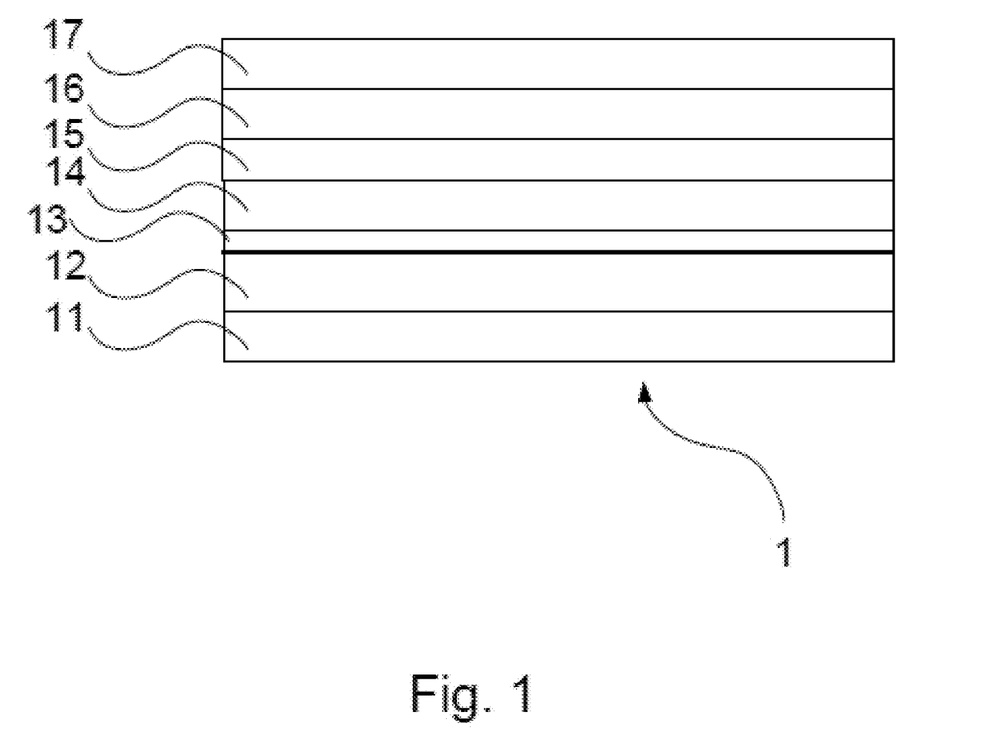
FIG. 1 schematically illustrates an example of an $In_xAl_yGa_{1-x-y}N$/GaN heterostructure.

FIG. 1 schematically illustrates an example of such a $In_xAl_yGa_{1-x-y}N$/G a N heterostructure 1. The heterostructure 1 comprises, when viewed from the bottom to the top, a SiC substrate 11, an $In_xAl_yGa_{1-x-y}N$ nucleation layer 12, an optional superlattice or an optional back barrier layer 13, a GaN channel layer 14, an optional exclusion layer 15 and an optional barrier layer 16 and an optional passivation layer (cap layer) 17.

Figure 2:
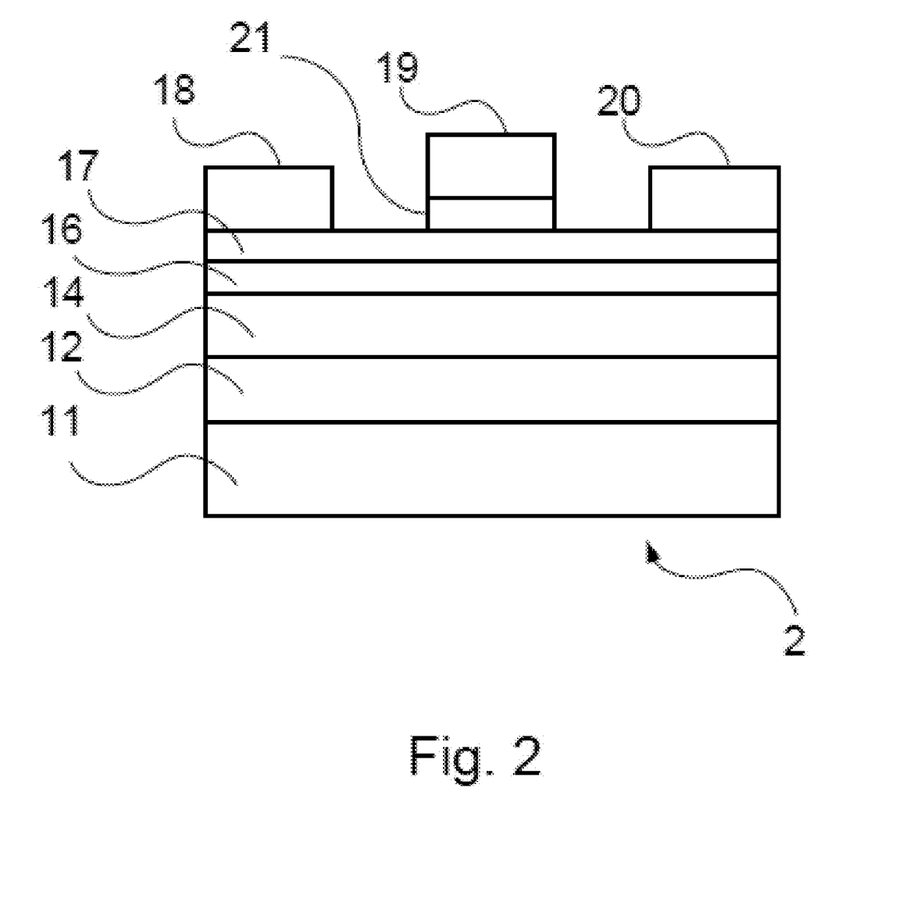
FIG. 2 schematically illustrates an example of a HEMT structure comprising an $In_xAl_yGa_{1-x-y}N$/GaN heterostructure.

In FIG. 2, an example of a HEMT structure 2 comprising an $In_xAl_yGa_{1-x-y}N$/GaN heterostructure is shown. The HEMT structure 2 in FIG. 2 comprises, when viewed from the bottom to the top, a SiC substrate 11, an $In_xAl_yGa_{1-x-y}N$ nucleation layer 12, a GaN channel layer 14, an exclusion layer 15, a barrier layer 16 and a passivation layer 17. On top of the passivation layer 17, source 18, gate 19 and drain 20 contacts are formed. Between the gate contact 19 and the passivation layer 17 there is an insulating layer 21.

The HEMT structure comprises an $In_xAl_yGa_{1-x-y}N$/GaN heterostructure shown in FIG. 2 is an example only and it is known to the skilled person that such a HEMT structure may be designed in many different ways.

A SiC substrate is used due to its high thermal conductivity properties in order to efficiently extract generated heat and to minimize temperature rise in the semiconductor device. The polytype of the SiC substrate may be for example 4H, 6H or 3C. The orientation of the SiC substrate may be represented by c-plane, a-plane and m-plane. For the c-plane there are two faces, Si face and C face, respectively. Upon production of the structures discussed in this disclosure either Si face or C face may be used. The substrate may preferably be an on-axis substrate. However, as an alternative a low angle off cut substrate, such as below 2 degrees off, may be used.

One purpose of the $In_xAl_yGa_{1-x-y}N$ nucleation layer 12 is to compensate for the lattice mismatch between the SiC substrate and the GaN channel layer, and to obtain high quality epitaxial growth of the channel layer on the SiC substrate. Another purpose of the nucleation layer is to enable growth of the GaN channel layer onto it. GaN does not nucleate two-dimensionally directly on some substrates, such as SiC, so there may be a need for a nucleation layer to change the surface potential, such that GaN can be grown. The nucleation layer may be grown directly on the SiC substrate, i.e. no additional layers need to be added between the substrate and the nucleation layer.

Typically, nucleation layers produced according to prior art methods, having a thickness of above 8-12 nm, start to relax due to a lattice mismatch of about 1% between the SiC substrate and the nucleation layer. A fully strained nucleation layer as shown herein may improve the crystalline quality and the morphology of the channel layer.

The nucleation layer grown by the method disclosed herein may be fully strained at a thickness of up to at least 100 nm. However, once the nucleation layer exceeds this thickness, the nucleation layer may start to relax due to the lattice mismatch.

Figure 5A:
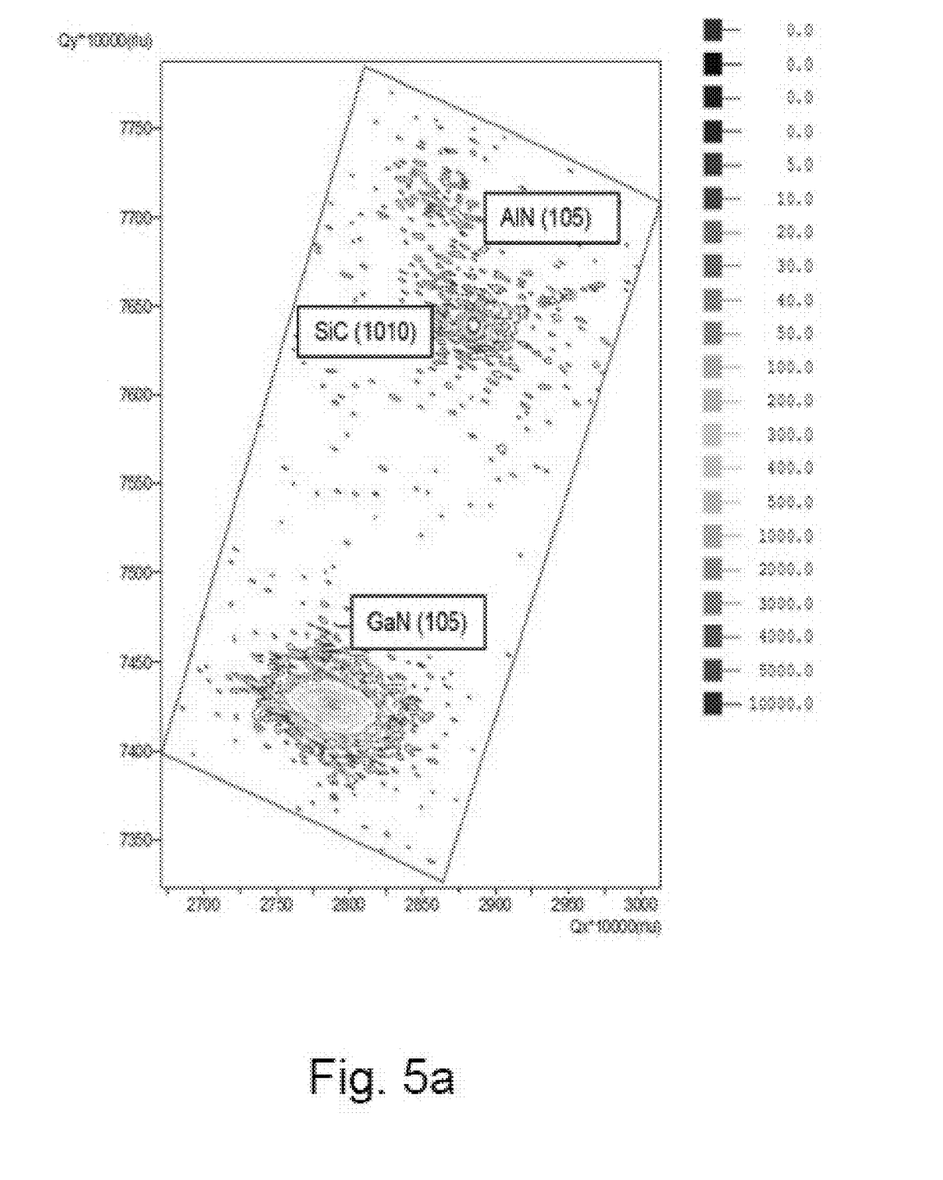
FIG. 5a shows a reciprocal space map (RMS) of a GaN channel layer grown on a relaxed AlN nucleation layer onto a SiC substrate, measured by XRD.
Figure 5B:
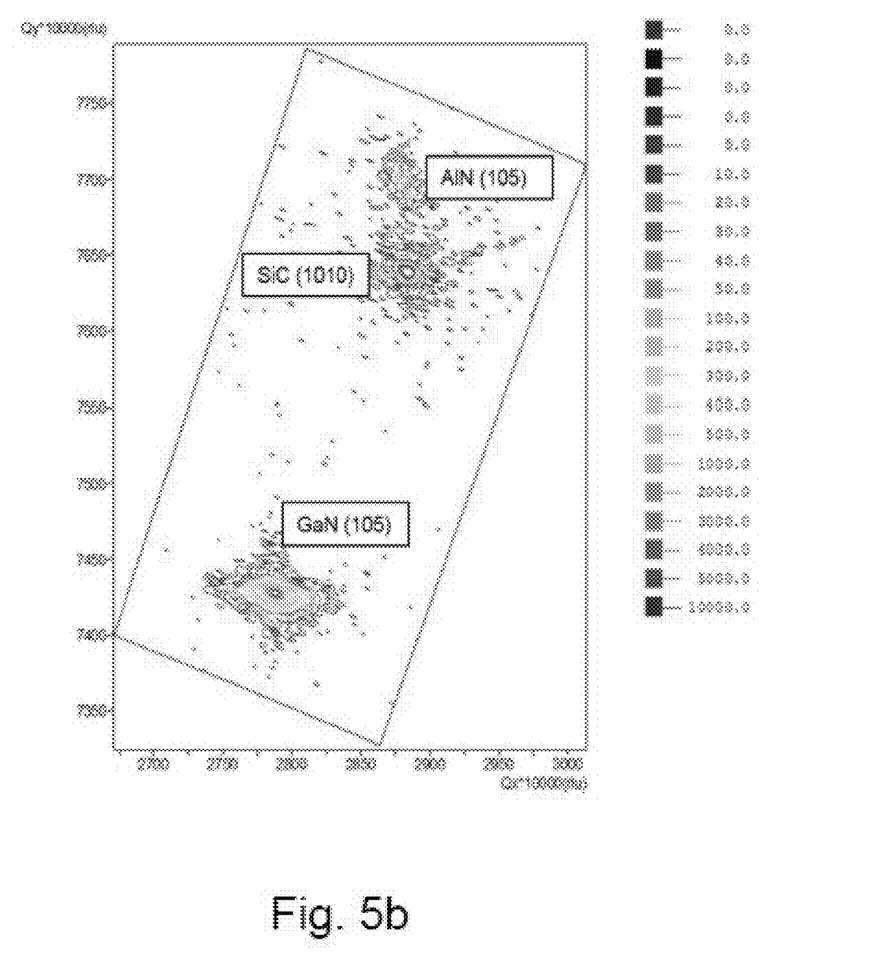
FIG. 5b shows a reciprocal space map (RMS) of a GaN channel layer grown on a pseudomorphic (fully-strained) AlN nucleation layer onto a SiC substrate, measured by XRD.

By "fully strained", is meant that the in-plane lattice constant of the nucleation layer is exactly the same, or exactly the same +/−0.15%, preferably +/−0.05% or +/−0.02%, as the in-plane lattice constant of the SiC substrate, Typically, if the nucleation layer is fully strained, its asymmetric X-ray reflex, like (105) would be well-aligned with the SiC substrate's asymmetric X-ray reflex along the x-axis, as shown in FIG. 5b.

The purpose of the GaN channel layer 14 is to let channel electrons move freely without considerably scattering with impurities and structural defects such as dislocations, pits and/or voids. The GaN channel layer is supposed to be fully relaxed when the desired thickness is reached, in contrast to the nucleation layer, which, if grown by a certain thickness to the method disclosed herein may be fully strained as discussed above.

Typically, in AlGaN/GaN heterostructures the GaN layer comprises a GaN channel portion and a GaN buffer portion. Herein, the GaN layer only comprises a channel portion and is hence referred to as the "channel layer".

The heterostructure may further comprise a so-called superlattice or an $In_{x5}Al_{y5}Ga_{1-x5-y5}N$ back barrier layer formed between the $In_xAl_yGa_{1-x-y}N$ nucleation layer and the GaN channel layer.

A superlattice is a periodic structure of layers of two or more materials, such as $Al_{x1}Ga_{1-x1}N$ and $Al_{x2}Ga_{1-x2}N$, wherein x1>x2. As an example x1 may be about 0.5 and x2 may be about 0.1.

Typically, the thickness of one layer is several nanometers and the total thickness of the superlattice layer is 10-50 nm. The different materials used in the superlattice may have different band gaps.

Alternatively a $In_{x5}Al_{y5}Ga_{1-x5-y5}N$ back barrier layer may be used. Such a $In_xAl_yGa_{1-x-y}N$ back barrier layer may have a composition either constant or graded Al content from low to high or high to low toward the GaN channel layer.

In the case of a back barrier layer, a composition in this back barrier layer may be constant in in a thickness direction thereof. In such a composition, preferably x5<0.05, more preferably x5<0.03 and most preferably x5<0.01. Moreover, preferably 0.01<y5<0.1, more preferably 0.03<y5<0.09 and most preferably 0.05<y5<0.08.

Alternatively, in the case of a back barrier layer, the composition may vary in the thickness direction thereof. In such case, preferably x5<0.05, more preferably x5<0.03 and most preferably x5<0.01.

In embodiments with a varied composition, y5 may be continuously decreased towards the GaN channel, preferably from 1 to 0, more preferably from 0.8 to 0.03, most preferably from 0.6 to 0.05.

Alternatively, in embodiments with a varied composition, y5 may be continuously increased towards the GaN channel, preferably from 0 to 0.7, more preferably from 0 to 0.6, most preferably from 0 to 0.5.

A barrier layer 16 of $In_xAl_yGa_{1-x-y}N$ or $Al_xGa_{1-x}N$ may be formed on top of the GaN channel layer. The purpose of the barrier layer is to induce the channel electrons.

One major advantage of using a barrier layer comprising indium is that a lattice matched condition can be achieved between the barrier layer 16 and the channel layer 14, when the percentage of indium in the barrier layer is about 17 to 18% and of Al is about 82 to 83%. The lattice match means that ideally no strain is built in the heterostructure. An indium comprising barrier layer, i.e. an InAlGaN/GaN heterostructure may be more thermally stable as compared to AlGaN/GaN or AlN/GaN heterostructures.

By the use of an indium comprising barrier layer, a lattice matched or a nearly lattice matched InAlN/GaN or InAlGaN/GaN heterostructure can be realized, while the two dimensional electron gas (2 DEG) density can still be obtained due to the high spontaneous polarization of the InAlN/GaN or InAlGaN barrier layer.

Moreover, an AlN exclusion layer may be formed between the barrier layer and the GaN channel layer. An exclusion layer 15 is needed when using a barrier layer comprising indium since the alloy scattering is severe when a barrier layer comprising indium is used. The purpose of the exclusion layer is to reduce the alloy and interface scatterings, thus enhancing the 2 DEG mobility.

Furthermore, an optional passivation layer 17 of SiN or GaN may be formed on the barrier layer 16.

The purpose of the passivation layer of GaN or SiN is to stabilize the surface conditions of the HEMT structure since the surface conditions influence the 2 DEG density. By the use of a GaN or SiN passivation layer the 2 DEG density may be increased or decreased, but the 2 DEG mobility will not change much.

Method for Heterostructure Growth

The layers of the heterostructure may be deposited by Metal Organic Chemical Vapor Deposition (MOCVD), which also is known as Metal Organic Vapor Phase Epitaxy (MOVPE). MOCVD, or MOVPE, is a chemical vapor deposition method in which a solid material is deposited onto a substrate by chemical reactions of vapor phase precursors. The method is mainly used for growing complex semiconductor multilayer structures.

In MOCVD, the precursors are metal-organic compounds, typically in combination with a hydride gas such as $NH_3$.

The precursors are transported, often by means of a carrier gas, into a reactor chamber in which at least one substrate is placed. Reactions of the precursors forming reactive intermediates and by-products take place on or in near vicinity of the substrate. The reactants are adsorbed on the substrate, forming a thin film layer and finally by-products are transported away from the substrate.

The pressure in a MOCVD system upon thin film growth normally ranges from a few mbar up to atmospheric pressure.

The reactor chamber may be of either cold-wall or hot-wall type. In a cold-wall reactor the substrate is typically heated from underneath while other parts in the growth zone, e.e. walls and/or ceiling, are kept cooler than the substrate. In contrast, in a hot-wall reactor the entire growth zone is heated, i.e. both the substrate and the susceptor's walls and ceiling.

For growth of the AlN and GaN layers discussed in this disclosure, a hot-wall VP508GFR, Aixtron reactor was used. (Refs: Doping of Al-content AlGaN grown by MOCVD, PhD thesis, D. Nilsson, 2014 and Wikipedia).

Pre-Treatment of SiC Substrates

Before growth of the nucleation layer, channel layer and optional additional layers, the SiC substrate may be pretreated in order to remove surface contamination that mainly may be composed of oxygen but also of carbon.

Preferably the pretreatment may be performed in situ, i.e. in the same chamber/reactor as the growth of the nucleation layer, channel layer and optionally additional layers will take place. As an alternative, the pretreatment may be performed ex situ, for example in a furnace. Hence, in the latter case the substrate is moved after pretreatment to the reactor in which the layers are grown. Typically, if correctly performed, moving the substrate does not give rise to new surface contamination.

Before the in situ pretreatment, the SiC substrate may, but need not, be cleaned and optionally rinsed and further optionally purged. For example, the SiC substrate may be cleaned in acetone, methanol, and a solution of $NH_4OH+H_2O_2+H_2O$ (1:1:5) at 80° C., and $HCl+H_2O_2+H_2O$ (1:1:5) at 80° C., each solution for 5 min, and finished with deionized water rinsing and $N_2$ purging and dip in HF solution.

For pretreatment, gases providing an etching effect on the substrate, e.g. $H_2$, HCl, or a combination thereof, may be allowed to flow into the reactor and hence interact with the substrate. As an alternative HF, HBr or $SiF_4$, or a combination of any one of these and $H_2$, may be used.

As an example, the flow rate of $H_2$ may be about 20-30 l/min and/or the flow rate of HCl about 100-200 ml/min.

The temperature may be ramped up to a pretreatment temperature and then ramped down immediately without keeping at the maximum temperature.

Pressure and temperature of the reactor as well as time sufficient to provide an oxygen free SiC substrate as detected by XPS may be determined by routine experimentation.

The pressure in the reactor upon pretreatment may be in the range of atmospheric pressure to 10 mbar, preferably about 50 mbar. Before beginning of the pretreatment, the background pressure in the reactor may be below $1\times10^{-3}$ mbar. Preferable the background pressure should be as low as possible.

The reactor may be heated to about 1250-1500° C. by e.g. inductive or resistive heating for pretreatment at a pressure in the reactor of 50 mbar.

It may be noted that the pretreatment also is dependent on the pressure, i.e. if the pretreatment is performed at a lower temperature, the pressure may be lower in order to remove the surface contamination, mainly comprising oxygen but also carbon, as compared to if it is performed in a higher temperature where a wider range of pressures may be used in order to remove the same amount of contamination.

As an example, the SiC substrate may be pretreated by $H_2$ in 1350° C. at 50 mbar during a total pretreatment time (i.e. temperature ramp up and ramp down) of at least 30 min, which may result in a SiC substrate with less than 5% monolayer oxygen (i.e. less than 5% of the surface area is covered by oxygen) as detected by XPS.

Growth of the Heterostructure

The steps of growing an $In_xAl_yGa_{1-x-y}N$/GaN heterostructure by MOCVD will now be described more in detail.

The sample, e.g. a part of a HEMT structure or a substrate onto which the heterostructure is grown is inserted into a MOCVD reactor (for details about the MOCVD method, see above).

The SiC substrate may be pretreated before being inserted into the MOCVD reactor, see details about pre-treatment above.

During the process steps described below the gallium, indium and aluminum precursors may be transported to the MOCVD reactor by at least one carrier gas, such as $H_2$, $N_2$ or Ar.

The aluminum precursor for growth of layers comprising aluminum may be e.g. trimethylaluminum, TMAl, $Al_2(CH_3)_6$, or triethylaluminum, TEA, $Al_2(C_2H_5)_6$.

The gallium precursor for growth of layers comprising gallium may be e.g. trimethylgallium, TMGa, $Ga(CH_3)_3$, or triethylgallium $Ga(C_2H_5)_3$, TEGa.

The indium precursor for growth of layers comprising indium may be e.g. trimethylindium, $In(CH_3)_3$, TMIn.

The precursor for growth of a SiN passivation layer may be $SiH_4$ in combination with $NH_3$.

The flow rate of the carrier gas, flowing through a precursor bubbler may be about 70 ml/min for the aluminum precursor, about 18 ml/min for the gallium precursor and about 70 ml/min for the indium precursor.

The precursor flow may merge with a main carrier gas flow, which may be on the order of 30 l/min for further transport to the reactor.

Flow rates of the precursors upon production of the heterostructure layers are discussed below.

The precursors may be provided at room temperature. As an alternative, at least one of the precursors may be heated in order to increase the vapor pressure and hence increase the growth of the different layers.

By "room temperature" is meant a temperature of 0° C. to 30° C., preferably 15° C. to 25° C.

The flow of the precursors and/or the carrier gases may be controlled by at least one mass flow controller which may be situated between each of the precursor containers and the MOCVD reactor.

The control of providing the precursors to the MOCVD reactor may be performed by opening or closing at least one valve situated between each of the precursor containers and the MOCVD reactor. The opening or closing may be performed manually or by computer control.

To eliminate build-up of gas bursting into the MOCVD reactor the flow of the precursors may be directed into a secondary line bypassing a main run line. This secondary line is called "vent line". A pressure balance may be provided between the vent line and the run line to avoid flow bursts when gas is switched into the main carrier flow.

Below, examples of flow rates of the precursors upon production of the different heterostructure layers are discussed. The flow rates and times the precursors are provided into the MOCVD reactor are dependent on many different parameters, such as the MOCVD reactor size, the sample/substrate size, the distance between the gas outlet of the precursor and the sample/substrate, the background pressure in the MOCVD reactor etc. Hence, the flow rate and time a precursor gas is provided may vary in different experimental set-ups.

The skilled person may generally be expected to be able to provide a layer of a predetermined thickness, composition and quality.

During all process steps discussed below, i.e. upon growth of all the layers in the heterostructure, a flow of ammonia, $NH_3$, may be provided. The flow rate of $NH_3$ may be kept constant during all process steps.

As an exception, the flow rate of $NH_3$ may be lower upon production of the nucleation layer.

Growth of the Nucleation Layer

If the pretreatment is performed in situ, the flow of the pretreatment gases, e.g. HCl and/or $H_2$, may be kept upon transition to the nucleation layer growth. If the pretreatment is performed ex situ the pretreated SiC substrate is transferred to the reactor in which the nucleation layer growth should take place. The transfer of the substrate may take place in ambient conditions, i.e. air. If the pretreatment takes place ex situ the temperature and pressure of the reactor may be set, when the SiC substrate has been transferred into the reactor chamber, in the same way as discussed below.

The temperature of the reactor may be lowered while the pressure in the reactor may be maintained. The lowering of the temperature may be performed in one step, i.e. the heating may be turned off or set at a lower temperature value.

When the temperature of the reactor is stabilized at about 800-1200° C., i.e. the so-called starting temperature for the nucleation layer growth, the pressure may be increased as compared to the pressure used during the pretreatment.

The pressure may be controlled by the use of a valve, such as a throttle valve, which may be situated between the reactor and a pump, such as a roots pump, dry process vacuum pump, or screw pump. When e.g. partly closing the throttle valve, the pumping on the reactor chamber is decreased and hence the pressure may increase due to the continuous flow of $H_2$ and/or HCl.

Both the temperature and the pressure may be allowed to stabilize and after stabilization, if using HCl as pretreatment gas, the inlet of HCl to the reactor may be switched off (e.g. by closing a valve between the HCl source and the reactor). If using $H_2$ as pretreatment gas the flow may be maintained as it may be used as carrier gas for transportation of at least one of the precursors upon AlN nucleation layer growth.

The carrier gas may be an inert gas such as $H_2$ or $N_2$. $H_2$ or $N_2$ may be used for transportation of the precursors to the reactor and $H_2$ and $N_2$ are used as carrier gas in the growth zone of the reactor. Preferably the carrier gas(es) are allowed to flow and optionally let into the reactor before the precursors are allowed to flow into the reactor (e.g. by opening a valve between the respective precursor and the reactor).

The containers storing the precursors may be temperature controlled, and the precursors may preferably be kept at room temperature. As an alternative, at least one of the precursors may be heated, which may increase the vapor pressure of the heated precursor such that the growth rate of the layer may be increased. The pressure inside the bubbler is also controlled using an electronic pressure controller. A lower pressure inside the bubbler will generate a higher amount of the precursor leaving the bubbler. However, as a too high flow rates/growth rate may lead to poorer quality of the layers, heating bubblers and/or decreasing the pressure inside the bubblers is not always optimal.

At least one mass flow controller may be placed between each precursor container and the reactor in order to control the flow rate of each precursor into the reactor.

The precursors, e.g. $Al_2(CH_3)_6$ and $NH_3$, are then simultaneously transported in gaseous form by the carrier gas into the reactor, hence the nucleation layer growth on the SiC substrate may begin.

As an example, for growth of an AlN nucleation layer, the TMAl flow rate upon growth of the nucleation layer may be 0.7 ml/min and the $NH_3$ flow rate may be 0.5 ml/min.

During nucleation layer growth, the temperature inside the reactor may be ramped up. As an alternative, the temperature may be constant.

The ramping rate may be 5-25° C./min as measured inside the reactor for a time period of 2 min to 20 min. Under such conditions, 7 min growth may result in an AlN thickness of about 30-40 nm. The thickness of the AlN nucleation layer should preferably be below 100 nm in the semiconductor device structure disclosed herein.

The temperature ramping may be incremental in small steps of e.g. $1/100$ to $1/2$ of the ramp rate. In the alternative, the ramping may be continuously linear, progressive or degressive. Preferably the ramping is continuously linear.

Growth of a Superlattice Layer

As discussed above, the superlattice may comprise of two $Al_xGa_{1-x}N$ layers, $Al_{x1}Ga_{1-x1}N$ and $Al_{x2}Ga_{1-x2}N$, wherein x1>x2, respectively.

For example, the superlattice may comprise five layers of AlN and five layers of GaN.

The flow rate of TMAl may be 0.7 ml/min and the flow rate of $NH_3$ may be 2 l/min upon growth of such an AlN layer. The flow rate of TMGa may be 1.06 ml/min and the flow rate of $NH_3$ may be 2 l/min upon growth of GaN.

The temperature in the MOCVD reactor may be in a range of 1040° C. to 1080° C. and the pressure may be 50 mbar.

Growth of a Back Barrier Layer

As an alternative to the optional superlattice, a back barrier layer may be grown onto the $In_xAl_yGa_{1-x-y}N$ nucleation layer.

The back barrier may be an AlGaN layer to improve the carrier confinement.

Carrier confinement means the capability of the channel electrons staying in the channel region while the HEMT device is under high electrical field. Therefore, the better the carrier confinement is, the less channel electrons would be injected out of the channel by high electrical field during the device operation.

The composition of the back barrier layer may be constant or graded from high to low or from low to high towards the GaN channel layer. This layer may be grown in a temperature range of 1040 to 1080° C. at pressure and at a pressure of about 50 mbar.

The Al composition is controlled by the gas phase ratio of (TMAl flow rate)/(TMAl flow rate+TMGa flow rate), as an AlGaN back barrier is used.

As an example, upon graded growth of AlGaN, the TMAl flow rate may ramped down from 0.7 ml/min to 0 ml/min and the TMGa flow rate is ramped up from 0 ml/min to 1.8 ml/min during a growth time of 10 min. The ramp rate is linear during the time.

Growth of the Channel Layer

Growth of a GaN channel layer directly on a nucleation layer or on a superlattice layer, will now be described.

The channel layer may preferably, but need not, be grown in the same reactor as the nucleation layer.

The precursors used for GaN channel layer growth may be trimethyl gallium, TMG, $Ga(CH_3)_3$, and ammonia, $NH_3$. As an example, the flow rates of the precursors may be 2 l/min for $NH_3$ and 1.8 ml/min for TMGa. The flow rate of the carrier gas flowing through the TMGa bubbler, e.g. $H_2$, may be 18 ml/min.

The flow of each of the precursors may be controlled by at least one mass flow controller that may be situated between the precursor container and the reactor. Each or both of the precursors may be transported by a carrier gas, such as $H_2$, $N_2$ or Ar, into the reactor. The temperature of the reactor may be about 1050° C. upon growth of the GaN channel layer. The pressure in the reactor upon GaN channel layer growth may be about 50 mbar.

The growth of the GaN channel layer may then be started when the temperature and pressure are stabilized. Under those conditions, the growth rate of the GaN layer may be about 400 to 1200 nm per hour.

Growth of a Barrier Layer

After the growth of the GaN channel layer a barrier layer may be grown on the GaN layer. Before starting the growth of the barrier layer, the temperature in the MOCVD chamber may be decreased, if an In-comprising barrier is used. The temperature may be decreased by turning off (or decreasing) the power provided by the power supply for heating the MOCVD reactor.

For the MOCVD reactor used for production of the heterostructure disclosed herein, it typically takes about 20 minutes to decrease the temperature to about 800° C.

As an example, the flow rate of TMAl may be 0.5 ml/min, the flow rate of TMIn may be 1.25 ml/min and the flow rate of $NH_3$ may be 2 l/min upon production of the barrier layer.

When the barrier does not comprise indium, the barrier may be an AlGaN layer (or AlN layer) in which the Al content may be in a range of 15% to 100%. The thickness of such an AlGaN layer may be in a range of 2 to 30 nm. The growth temperature and pressure may be the same as upon production of the GaN channel layer.

The flow rate of $NH_3$ may be the same as upon production of the GaN channel layer.

Growth of an Exclusion Layer

An AlGaN exclusion layer may be grown between the barrier layer and the GaN channel layer. The aluminum content in such an AlGaN exclusion layer is typically between 50 to 70%.

The growth temperature and pressure may be the same as upon growth of the GaN channel layer. The flow rate of $NH_3$ may be 2 l/min, i.e. the same as upon growth of the GaN channel layer. The flow rate of TMAl may be 0.35 ml/min.

The thickness of the exclusion layer may be 1 to 2 nm.

Growth of a Passivation Layer

Finally, an optional passivation/cap layer of GaN or SiN may be grown onto the barrier layer.

As an example, for growth of a GaN cap layer the flow rate of TMGa may be 1.2 ml/min and the flow rate of $NH_3$ may be 2 l/min.

As an example, for growth of a SiN passivation layer the flow rate of 250 ppm $SiH_4$ may be 250 ml/min and the flow rate of $NH_3$ may be 1.0 ml/min.

The temperature in the MOCVD reactor upon growth of the passivation layer may be the same as the temperature upon growth of the barrier layer, i.e. about 800° C., if an In-comprising barrier is used, or about 1050° C. if the barrier that does not comprise indium is used.

Experimental Details

X-ray Diffraction (XRD) characterization was performed by a high-resolution X-ray diffractometer (Philips X'Pert MRD) with $\lambda$=0.15406 nm of Cu Kai radiation to characterize the crystalline quality of the GaN channel layer. The HR-XRD system is equipped with a hybrid mirror and a triple-axis crystal as the primary and secondary optics, respectively, in which a resolution of ~0.003° (~11 arcsec) can be achieved.

The FWHM of the rocking curves of the GaN (002) and (102) peaks was measured in the symmetric and the skew diffraction geometry.

The surface morphology of the heterostructures was characterized by Atomic Force Microscopy (AFM). An AFM system (Veeco Dimension 3100) was employed in tapping mode. The system permits the spatial resolution 0.3~1 Å along the vertical direction and 1~5 nm along the lateral direction, the resolutions of which are limited by the system background noise and the tip radius of curvature of 5~10 nm used in this study, respectively.

The surface topography of the heterostructures was characterized by optical microscopy (OM). An OM system with Nomarski diffraction interference contrast was employed for the measurement. The total magnification of ×400 was used to take images. Characterization by XRD, AFM and OM were performed ex situ.

Characterization Results of the Heterostructure

Figure 3A:
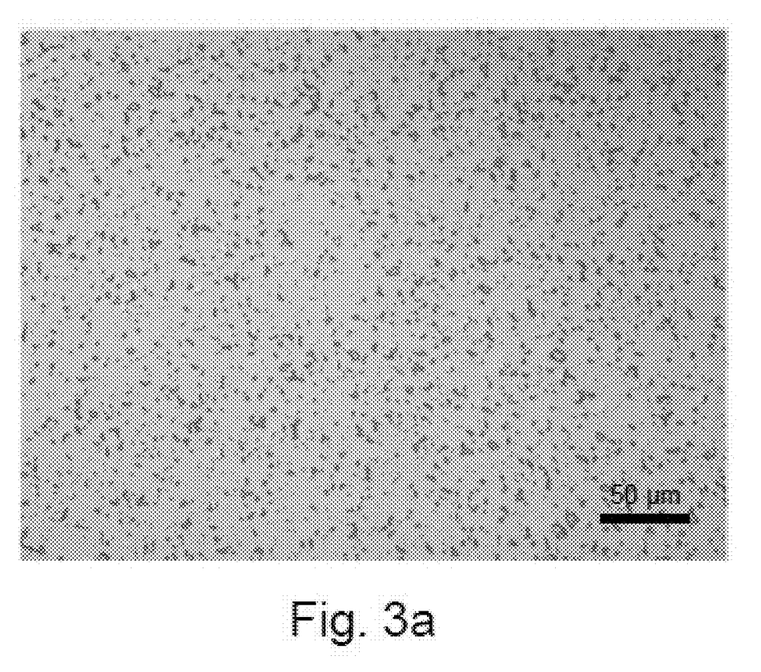
FIGS. 3a and 3b show AFM pictures of a GaN layer in an $In_xAl_yGa_{1-x-y}N$/GaN heterostructure grown by a conventional process.
Figure 4A:
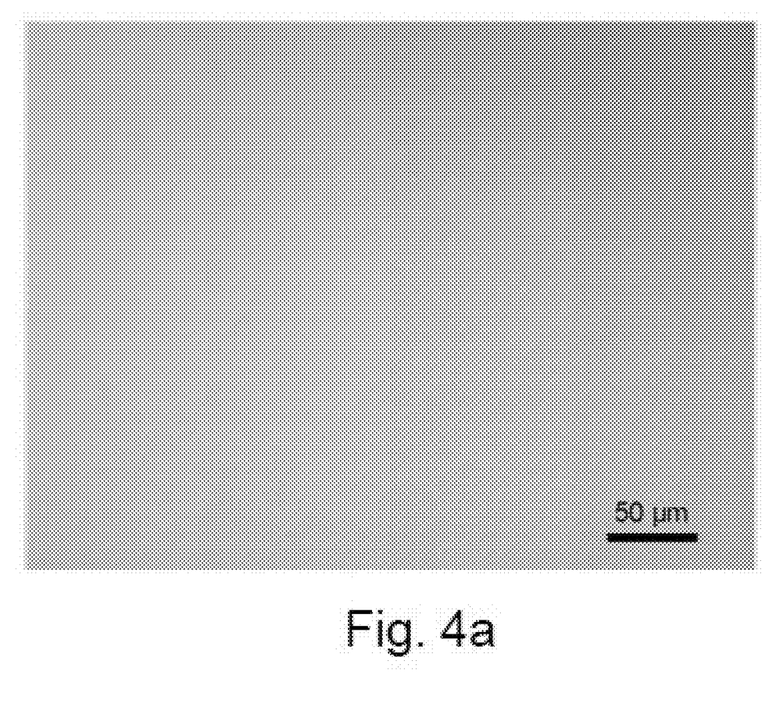
FIGS. 4a and 4b show AFM pictures of a GaN layer in an $In_xAl_yGa_{1-x-y}N$/GaN heterostructure grown by the process disclosed herein.

In FIGS. 3a and 4a optical microscope (OM) images of GaN channel layers in a heterostructure produced according to a prior art method (FIG. 3a) and according to the process disclosed herein (FIG. 4a), respectively, are shown.

For both samples, the thickness of the GaN channel layer is 0.3 µm and SiC substrates are used.

The OM images show the surface morphology in a large scale area. The dark spots are structural defects such as pits and voids.

When comparing FIG. 3a and FIG. 4a it is seen that the GaN channel layer in the heterostructure produced according to the method disclosed herein has significantly less structural defects, i.e. improved surface morphology, as compared to the GaN channel layer in the heterostrucuture produced according to a prior art method.

Figure 3B:
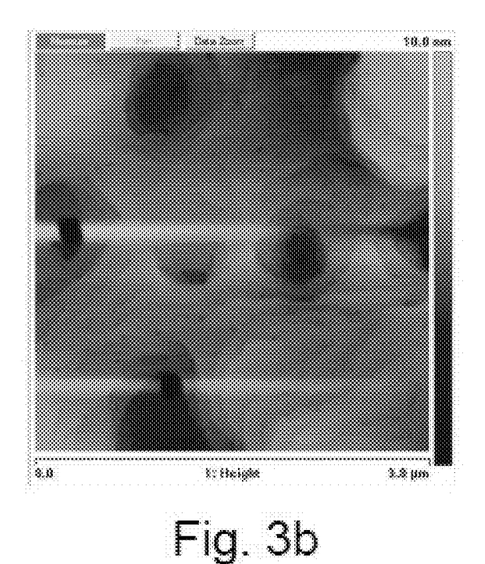
Figure 4B:
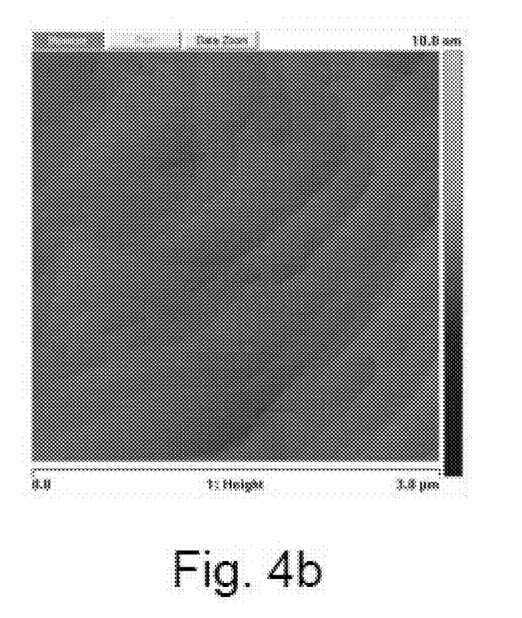

In FIGS. 3b and 4b AFM images of GaN channel layers produced according to a prior art method and according to the process disclosed herein, respectively, are shown.

The AFM images show the surface morphology in an area size of 3×3 pmt. FIG. 3b illustrating a GaN channel layer in the heterostrucuture produced according to a prior art method shows that the surface has a significantly high density of structural defects such as pits and voids.

As seen in the figures, the GaN channel layer in the heterostructure grown by the method disclosed herein (FIGS. 4a-b) has a largely improved morphology and significantly lower defect density as compared with the GaN layer grown by the prior art method (FIGS. 3a-b) which has a significantly high density of structural defects like pits and voids.

The improved crystallinity is confirmed by the rocking curves of the GaN channel layer shown in FIGS. 4a-b. The GaN channel layer shown in FIGS. 4a and 4b presents a rocking curve with a (002) peak having a FWHM of about 88 arcsec, and a (102) peak having a FWHM of 255 arcsec. These values can be compared with the GaN channel layer shown in FIGS. 3a and 3b which presents a rocking curve with a (002) peak having a FWHM of about 515 arcsec, and a (102) peak having a FWHM of 536 arcsec.

FIGS. 5a and 5b show reciprocal space maps (rlu=reciprocal lattice unit) of GaN layers of a relaxed AlN nucleation layer (FIG. 5a) and of a pseudomorphic (fully strained) AlN nucleation layer (FIG. 5b) on SiC substrates. By the method for producing a heterostructure disclosed herein pseudomorphic (fully strained) high crystallinity AlN nucleation layers can be produced. For a fully strained AlN, the asymmetric AlN reflex would be aligned with the asymmetric SiC reflex along the x-axis, as seen in FIG. 5b. The GaN channel layers in both FIGS. 5a and 5b are relaxed.

The invention claimed is:

1. A heterostructure for a high electron mobility transistor (HEMT), comprising:
   a SiC substrate,
   an $In_xAl_yGa_{1-x-y}N$ nucleation layer, wherein x=0-1, y=0-1, formed directly on the SiC substrate, and
   a GaN channel layer formed directly on the $In_xAl_yGa_{1-x-y}N$ nucleation layer, and
   a barrier layer formed on the GaN channel layer, wherein:
   a thickness of the GaN channel layer is 50 to 500 nm;
   a total thickness of the heterostructure, consisting of the $In_xAl_yGa_{1-x-y}N$ nucleation layer, the GaN channel layer, and the barrier layer, not including a thickness of the SiC substrate, is in a range of 54 nm to 730 nm;
   the $In_xAl_yGa_{1-x-y}N$ nucleation layer is fully strained, wherein its in-plane lattice constant is exactly the same as an in-plane lattice constant of the SiC substrate, or is within +/−0.15% of an in-plane lattice constant of the SiC substrate;
   the GaN channel layer presents a rocking curve with a (002) peak having a full width half maximum (FWHM) below 300 arcsec, and a rocking curve with a (102) peak having a FWHM below 400 arcsec as determined by X-ray diffraction (XRD); and
   a surface of the GaN channel layer of the heterostructure prior to formation of any additional layers thereon exhibits root mean square (RMS) roughness of below 1.8 nm over a 10×10 µm² scan area, or of below 1 nm over a 3×3 µm² scan area.

2. The heterostructure according to claim 1, wherein the $In_xAl_yGa_{1-x-y}N$ nucleation layer has a homogenous or varying content of Al.

3. The heterostructure according to claim 1, further comprising an AlN exclusion layer formed on the GaN channel layer, and the barrier layer formed on the AlN exclusion layer.

4. The heterostructure according to claim 3, further comprising a passivation layer of SiN or GaN formed on the barrier layer.

5. The heterostructure according to claim 1, wherein an unintentional doping concentration of carbon in the GaN channel layer is less than 1E+17 $cm^{-2}$.

6. A method of producing a heterostructure according to claim 1, by metal organic chemical vapor deposition (MOCVD), for a high electron mobility transistor (HEMT), the method comprising:
   providing a SiC substrate,
   providing an $In_xAl_yGa_{1-x-y}N$ nucleation layer, wherein x=0-1, y=0-1, formed directly on the SiC substrate,
   providing a GaN channel layer formed directly on the $In_xAl_yGa_{1-x-y}N$ nucleation layer, and
   providing a barrier layer formed on the GaN channel layer,
   wherein the pressure upon growth of the $In_xAl_yGa_{1-x-y}N$ nucleation layer and of the GaN channel layer is 20 to 200 mbar,
   the temperature upon growth of the $In_xAl_yGa_{1-x-y}N$ nucleation layer is 900 to 1200° C., and
   the temperature upon growth of the GaN channel layer is 1000 to 1150° C.

7. The method of producing a heterostructure for a high electron mobility transistor (HEMT) according to claim 6, comprising a further step of providing an AlGaN exclusion layer, wherein the Al content is 40 to 80%, between the barrier layer and the GaN channel layer.

8. The method of producing a heterostructure for a high electron mobility transistor (HEMT) according to claim 6, comprising a further step of providing a passivation layer of SiN or GaN on the barrier layer.

9. A method of producing a HEMT device, comprising the steps of providing a heterostructure according to claim 8, and providing a source, a gate contact and a drain contact onto the passivation layer.

10. The method according to claim 9, further comprising the step of providing an insulating layer between the passivation layer and the gate contact.

11. A method of producing a heterostructure according to claim 1, by metal organic chemical vapor deposition (MOCVD), for a high electron mobility transistor (HEMT), the method comprising the steps of:
   providing a SiC substrate;
   growing an $In_xAl_yGa_{1-x-y}N$ nucleation layer, wherein x=0-1, y=0-1, directly on the SiC substrate;

growing a GaN channel layer directly on the $In_xAl_yGa_{1-x-y}N$ nucleation layer; and growing a barrier layer on the GaN channel layer.

12. The method of claim 11, wherein the $In_xAl_yGa_{1-x-y}N$ nucleation layer has a homogenous or varying content of Al.

13. The method of claim 11, further comprising forming an AlN exclusion layer on the GaN channel layer, and forming the barrier layer on the AlN exclusion layer.

14. The method of claim 13, further comprising forming a passivation layer of SiN or GaN on the barrier layer.

* * * * *

UNITED STATES PATENT AND TRADEMARK OFFICE
CERTIFICATE OF CORRECTION

| | |
|---|---|
| PATENT NO. | : 12,002,881 B2 |
| APPLICATION NO. | : 16/632347 |
| DATED | : June 4, 2024 |
| INVENTOR(S) | : Jr-Tai Chen et al. |

It is certified that error appears in the above-identified patent and that said Letters Patent is hereby corrected as shown below:

In the Specification

Column 5, Line 21, "$In_xAl_yGa_{1-x-y}N/G\ a\ N$" should be -- $In_xAl_yGa_{1-x-y}N/GaN$ --.

Column 13, Line 21, "3×3 pmt" should be -- 3×3 $\mu m^2$ --.

Signed and Sealed this
Thirtieth Day of July, 2024

Katherine Kelly Vidal
*Director of the United States Patent and Trademark Office*